United States Patent [19]

Noguchi et al.

[11] Patent Number: 5,006,668

[45] Date of Patent: Apr. 9, 1991

[54] CONNECTING MECHANISM OF CENTRAL CONDUCTORS OF A COAXIAL CABLE AND A PROBE

[75] Inventors: Hiroshi Noguchi, Hamura; Kazuo Kawada, Murayama, both of Japan

[73] Assignee: Stack Electronics Co., Ltd., Akishima, Japan

[21] Appl. No.: 411,570

[22] Filed: Sep. 22, 1989

[30] Foreign Application Priority Data

Apr. 26, 1989 [JP] Japan ................. 1-48316[U]

[51] Int. Cl.$^5$ ........................... H02G 15/08
[52] U.S. Cl. ................. 174/75 C; 324/158 P; 439/578; 439/583
[58] Field of Search ........... 174/75 C; 439/578, 581, 439/583, 675; 324/158 P, 725, 149

[56] References Cited

U.S. PATENT DOCUMENTS

| | | | |
|---|---|---|---|
| 3,022,482 | 2/1962 | Waterfield et al. | 174/750 |
| 3,040,288 | 6/1962 | Edlen et al. | 174/750 |
| 3,070,649 | 12/1962 | Edlen et al. | 174/750 |
| 3,295,076 | 12/1966 | Kraus | 174/750 |
| 4,249,790 | 2/1981 | Ito et al. | 439/583 |
| 4,321,532 | 3/1982 | Luna | 324/158 P X |
| 4,764,722 | 8/1988 | Coughlin et al. | 324/158 P |

FOREIGN PATENT DOCUMENTS 59-40857 3/1984 Japan.

Primary Examiner—Morris H. Nimmo
Attorney, Agent, or Firm—Lackenbach Siegel Marzullo & Aronson

[57] ABSTRACT

According to this invention a central conductor of a probe is connected to that of a coaxial cable by joining a shell and cylindrical metal fitting. An end of an inner insulator of the coaxial cable enters a larger diameter portion of an elastic cylinder which fits in a fixed position of the cylindrical metal fitting, a central conductor of the coaxial cable stretching further to penetrate a narrower diameter portion adjacent to the larger diameter portion. A pin is pressed into the narrower diameter portion from the other side of the larger diameter portion side. By this operation the central conductor is held tightly between the surfaces of the narrower diameter portion and the pin. When the connection of the probe and cylindrical metal fitting is completed, the pin deforms the elastic cylinder so that the central conductor of the probe contacts tightly with the pin, which enables complete conductivity between the central condutors.

5 Claims, 1 Drawing Sheet

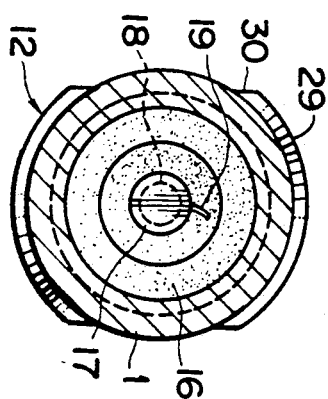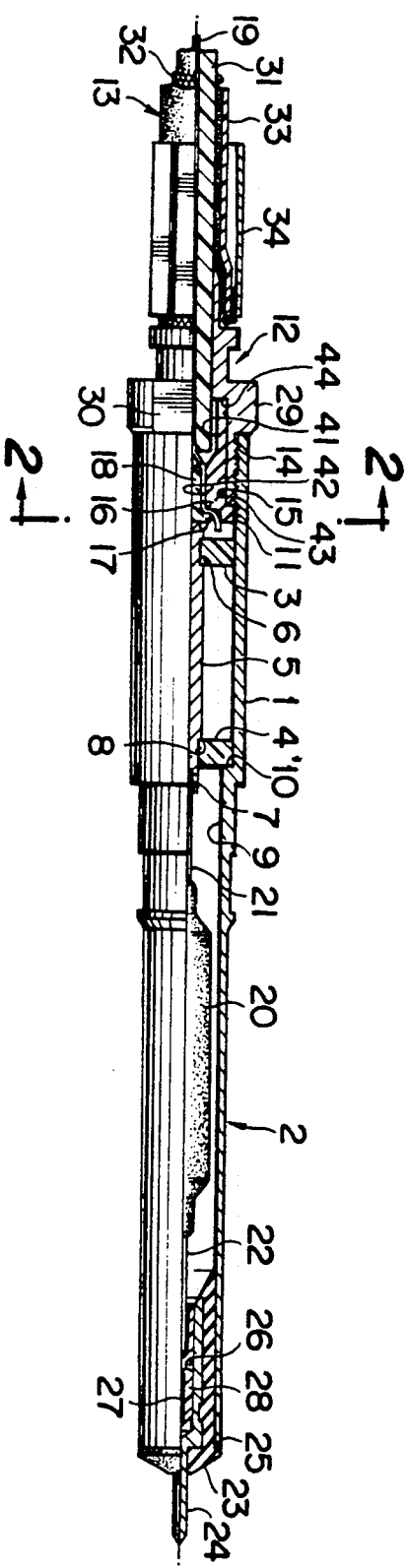

CONNECTING MECHANISM OF CENTRAL CONDUCTORS OF A COAXIAL CABLE AND A PROBE

BACKGROUND OF THE INVENTION

1. Field of the Invention

This invention relates to a mechanism for connecting a central conductor of a coaxial cable to a probe of a measuring device that can be used to examine wave forms of voltage signals in an electric circuit and the like.

2. Prior Art

In order to connect a central conductor, i.e., the inner conductor of a coaxial cable to a central conductor, i.e., an axially, centrally aligned conductor of a probe, soldering is used generally.

In case soldering cannot be used, the conductors are connected to each other in the following manner:

A central conductor of a probe is connected to a leaf spring having an eccentric fulcrum. An end of a central conductor of a coaxial cable is held on a threaded cylindrical metal fitting by a plastic lock. The central conductor of the coaxial cable is pressed into contact with the leaf spring, when the cylindrical metal fitting is screwed in a sleeve of the probe.

Soldering techniques take much time partly because parts involved are small, and if soldering is not complete, electric conductivity is not good.

The use of a leaf spring also takes much time as the fulcrum has to be eccentric and after the probe is used for a long period, there may not be enough resilience left in the leaf spring to maintain a good connection. Also, the plastic lock contracts at low temperatures, which also can cause a bad connection.

SUMMARY OF THE INVENTION

An object of this invention is to provide a mechanism for connecting the central conductors of a probe and a coaxial cable which does not require soldering.

Another object of this invention is to provide a connecting mechanism, wherein an outer casing of a probe has only to be joined to a cylindrical metal fitting, which is conventionally positioned on a terminal or end portion of a coaxial cable, in order to connect a central conductor of a probe and that of a coaxial cable on substantially the same axis.

Further object of this invention is to save the time previously required when central conductors of a probe and a coaxial cable are connected by means of a leaf spring.

Further object of this invention is to keep a good electrical connection between the central conductors by the restoring power, i.e., resilience, of an elastic cylinder which is produced when the shell and a cylindrical metal fitting are joined to deform the elastic cylinder by inserting a central conductor of a coaxial cable into the axial recess of the elastic cylinder, and by pressing a pin into the axial recess to keep tight the contact between the central conductor, the pin and the surface of the axial recess.

Further object of this invention is to prevent the central conductors from deforming outward through the opening between the elastic cylinder and the coaxial cable to short-circuit with a cylindrical metal fitting, by forming a larger diameter portion and a narrower diameter portion in the elastic cylinder to receive an end of the inner insulator of the coaxial cable in the larger diameter portion.

Further object of this invention is to omit other insulators by making the elastic cylinder of insulating material.

Further object of this invention is to prevent corrosion of silver plating on the central conductor of the coaxial cable, by making the elastic cylinder of silicone rubber.

Further object of this invention is to position the elastic cylinder at a fixed place in the cylindrical metal fitting, by forming a flange to contact with an end of the elastic cylinder.

Further object of this invention is to position the elastic cylinder with respect to the cylindrical metal fitting, by reducing the opening of the cylindrical metal fitting.

The other objects of this invention will be understood easily by referring to the detailed description of the invention mentioned below and attached Figures.

BRIEF DESCRIPTION OF THE DRAWINGS

FIG. 1 is an elevational view partly in section showing an embodiment of a connecting mechanism of this invention, and FIG. 2 is an enlarged cross-sectional view of the mechanism of FIG. 1 sectioned along line 2—2 of FIG. 1.

DETAILED DESCRIPTION OF THE INVENTION

A conductive outer shell or casing 1 of a probe 2 coaxially encloses the central conductor 5 of probe 2 which is supported by a pair of rings 3 and 4 made of insulating material. The ring 3 fits in a ring-like peripheral groove 6, adjacent one end of the central conductor 5 of probe 2. The other ring 4 fits on a reduced peripheral portion 7 adjacent the other end of the central conductor 5 of probe 2. One side of the ring 4 contacts with step 8, and the other side of the ring 4 contacts with step 10 which is formed on an inner wall of the shell 1 by portion 9 of reduced diameter. The ring 4, step 8 and step 10 prevent the central conductor 5 of probe 2 from moving in an axial direction. The central conductor 5 of probe 2 is thus fixedly enclosed by the shell 1. In other words, any load on the central conductor 5 cannot make it advance farther into the probe 2. A threaded engaging means 11 is formed on an end of the shell 1.

A conductive cylindrical metal fitting 12 is positioned conventionally on an end of coaxial cable 13 having threaded engaging means 14, which engages the threaded engaging means 11 of the shell 1.

A cylindrical elastic member 16 fits closely in the cylindrical opening 15 of the cylindrical metal fitting 12 and is held in a fixed position A conductive pin 18 having a flanged end 17 is pressed coaxially into and penetrates a coaxial recess 42 of the elastic cylinder 16, and the outer surface of the pin 18 and the inner surface of coaxial recess 42 of elastic cylinder 16 grasp tightly an end portion of the central conductor 19 which penetrates the coaxial recess of elastic cylinder 16, which establishes electric contact between the central conductor 19 and the pin 18.

The shell of probe 2 is threadably connected to the cylindrical metal fitting 12 by means of the threaded engaging means 11 and 14. When the connection is completed, an end of the pin 18 contacts the central conductor 5, and the pin 18 advances to deform the elastic cylinder 16, and the central conductor 5 is positioned fixedly with respect to shell 1. Consequently, when the connection is completed, the restoring resilient force of the elastic cylinder 16 continuously acts against the pin 18, so that the pin 18 is held in contact with the central conductor 5.

An encapsulated block 20 enclosing electric parts such as condensers and so on, is provided with lead wires 21 and 22 which project from both ends thereof The lead wire 21 is connected with the central conductor 5 of probe 2 The lead wire 22 is connected to a touching needle 24 fitted in an end of the shell 1 through an insulating material 23. The end of the shell 1 contacts a flange 25 which is formed on the insulating material 23. The touching needle 24 is provided with an axial hole 26 therein and is electrically connected with the central conductor 5 of probe 2 by joining part 28 having a split groove 27 fixed to an end of the lead 22 which is inserted in the axial hole 26. On the outer periphery of the cylindrical metal fitting 12, a flange 29 is formed having planes 30 shaped to receive a spanner.

Numeral 31 indicates the inner insulator of the coaxial cable 13 which surrounds central conductors 19. A braided outer conductor 32 is arranged around the inner insulator 31 and outer insulator 33 encloses the outer conductor 32. An end of the outer insulator 33 is removed and the outer conductor 32 is folded back round the outer insulator 33 and fits tightly on the periphery of the reduced end of the cylindrical metal fitting 12. A clamp 34 creates a tight contact between the outer conductor 32 and the cylindrical metal fitting 12 to establish electric conduction between them and to prevent the cable from slipping out. The above-mentioned method to join the coaxial cable 13 and the cylindrical metal fitting 12 is conventional.

Elastic cylinder 16 has a larger diameter coaxial recess portion 41, which receives the inner insulator 31 of the coaxial cable 13, and a narrower diameter coaxial recess portion 42, in which the electrically conductive pin 18 is inserted tightly into and penetrates. In the narrower diameter coaxial recess portion 42 the pin 18 is tightly grasped therein by the elastic cylinder 16. Insulation is well established as the inner insulator 31 fits into the larger diameter coaxial recess portion 41. When the pin 18 is pressed in, the narrow central conductor 19 may be pushed back and bent. This deformation occurs however in the larger diameter recess portion 41, so that the central conductor 19 does not short-circuit with the cylindrical metal fitting 12.

The elastic cylinder 16 is made of insulating material, and insulation is maintained between the pin 18 and the cylindrical metal fitting 12. If silicone rubber is used as the insulating material, silver plating on the central conductor is not corroded.

The elastic cylinder 16 comprises a flanged end 43 around and when the elastic cylinder 16 is pressed into the cylindrical metal fitting the flange 43 comes into contact with an end of the metal fitting 12, and the cylinder 16 stops moving and is kept at a fixed position.

The cylindrical metal fitting 12 comprises a step 44 that is formed by reducing the opening 15 and when the elastic cylinder 16 is pressed into the opening 15 an end of the cylinder 16 comes into contact with the step 44, and the cylinder 16 stops moving axially in opening 15 and is kept at a fixed position.

We claim:

1. A connecting device for establishing electrical contact between an end portion of a central conductor of a coaxial cable and a conducting element of a probe which is fixedly positioned within a surrounding probe casing having an open end, said connecting device comprising a cylindrical fitting fixed to an end portion of a coaxial cable having an axially extending opening defined by a cylindrical side wall for surrounding the end portion of a coaxial cable located therein and spaced from said cylindrical side wall;

a cylindrically shaped elastic member fitted tightly within said cylindrical opening of said fitting having a first cylindrical coaxial recess at a first end thereof to receive the end portion of the coaxial cable and a second coaxial recess at a second end of the elastic member communicating with the first recess to receive the end portion of the central conductor of the coaxial cable;

an electrically conductive pin-shaped member forcibly inserted and engaged within said second cavity of said elastic member and in contact with said central conductor of said coaxial cable, and having a flanged end portions adjacent the second end of the elastic member for contacting a probe conducting element fixedly positioned in an open-ended surrounding casing.

2. A connecting device in accordance with claim 1, wherein the end portion of the central conductor of a coaxial cable is pressed in contact with the pin-shaped member by a restoring force developed in the elastic member by forcible insertion of the pin-shaped member therein.

3. A connecting device in accordance with claim 1, wherein the first recess of the elastic member has a larger diameter than the second recess of the elastic member.

4. A connecting device in accordance with claim 1, wherein the elastic member is formed of the electrically insulating material.

5. A connecting device in accordance with claim 1, wherein the opening of the fitting has a portion of reduced width which contacts the elastic member to resist axial movement of the elastic member in the opening of the fitting.

* * * * *